(12) United States Patent
Baker

(10) Patent No.: US 6,813,208 B2
(45) Date of Patent: Nov. 2, 2004

(54) SYSTEM AND METHOD FOR SENSING DATA STORED IN A RESISTIVE MEMORY ELEMENT USING ONE BIT OF A DIGITAL COUNT

(75) Inventor: R. Jacob Baker, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/192,463

(22) Filed: Jul. 9, 2002

(65) Prior Publication Data

US 2004/0008555 A1 Jan. 15, 2004

(51) Int. Cl.⁷ ................................................ G11C 7/02
(52) U.S. Cl. .................... 365/207; 365/46; 365/148; 365/189.01; 365/236
(58) Field of Search .................. 365/46, 148, 189.01, 365/236, 207

(56) References Cited

U.S. PATENT DOCUMENTS

| | | | |
|---|---|---|---|
| 3,818,501 A | 6/1974 | Fiorino | 360/40 |
| 4,197,515 A | 4/1980 | Hornfeldt et al. | 333/165 |
| 4,281,291 A | 7/1981 | Lamare et al. | 329/50 |
| 4,369,501 A | 1/1983 | Brown et al. | 365/8 |
| 4,536,851 A | 8/1985 | Germanton et al. | 364/557 |
| 5,243,544 A | 9/1993 | Schoess | 364/566 |
| 5,329,480 A | 7/1994 | Wu et al. | 365/170 |
| 5,801,652 A | 9/1998 | Gong | 341/131 |
| 5,907,299 A | 5/1999 | Green et al. | 341/143 |
| 5,986,598 A | 11/1999 | Mittel | 341/143 |
| 6,038,166 A | 3/2000 | Wong | 365/185.03 |
| 6,128,239 A | 10/2000 | Perner | 365/209 |
| 6,188,615 B1 | 2/2001 | Perner et al. | 365/189.01 |
| 6,243,034 B1 | 6/2001 | Regier | 341/166 |
| 6,317,375 B1 | 11/2001 | Perner | 365/206 |
| 6,317,376 B1 | 11/2001 | Tran et al. | 365/210 |
| 6,385,111 B2 | 5/2002 | Tran et al. | 365/210 |
| 6,396,329 B1 | 5/2002 | Zerbe | 327/336 |
| 6,414,882 B1 * | 7/2002 | Butler | 365/189.09 |
| 6,504,750 B1 * | 1/2003 | Baker | 365/148 |
| 6,697,444 B1 | 2/2004 | Iizuka et al. | 375/343 |
| 2002/0101251 A1 | 8/2002 | Shimizu | 324/677 |
| 2002/0117895 A1 | 8/2002 | Kemp et al. | 307/10.1 |
| 2002/0126524 A1 | 9/2002 | Sugibayashi et al. | 365/158 |
| 2003/0083584 A1 | 5/2003 | Yonce | 600/509 |
| 2003/0151532 A1 | 8/2003 | Chen et al. | 341/120 |
| 2003/0198075 A1 | 10/2003 | Brown | 365/145 |
| 2004/0091035 A1 | 5/2004 | Palaskas et al. | 375/229 |

* cited by examiner

Primary Examiner—Van Thu Nguyen
(74) Attorney, Agent, or Firm—Dorsey & Whitney LLP

(57) ABSTRACT

A method and system sense the logic state of an unknown initial data bit stored in a selected resistive memory cell. According to one method, a first count representing the logic state of the unknown initial data bit stored in the selected memory cell is generated. A second count is then generated, and represents a data bit having a first known logic state stored in the selected memory cell. A third count is then generated, and represents a data bit having a second known logic state stored in the selected memory cell. The logic state of the initial unknown data bit stored in the selected memory cell is then determined from the first, second, and third counts.

64 Claims, 5 Drawing Sheets

SYSTEM AND METHOD FOR SENSING DATA STORED IN A RESISTIVE MEMORY ELEMENT USING ONE BIT OF A DIGITAL COUNT

TECHNICAL FIELD

The present invention relates generally to integrated circuits, and more specifically to sensing data stored in an integrated circuit memory device.

BACKGROUND OF THE INVENTION

Computer systems, video games, electronic appliances, digital cameras, and myriad other electronic devices include memory for storing data related to the use and operation of the device. A variety of different memory types are utilized in these devices, such as read only memory (ROM), dynamic random access memory (DRAM), static random access memory (SRAM), flash memory (FLASH), and mass storage such as hard disks and CD-ROM or CD-RW drives. Each memory type has characteristics that better suit that type to particular applications. For example, DRAM is slower than SRAM but is nonetheless utilized as system memory in most computer systems because DRAM is inexpensive and provides high density storage, thus allowing large amounts of data to be stored relatively cheaply. A memory characteristic that often times determines whether a given type of memory is suitable for a given application is the volatile nature of the storage. Both DRAM and SRAM are volatile forms of data storage, which means the memories require power to retain the stored data. In contrast, mass storage devices such as hard disks and CD drives are nonvolatile storage devices, meaning the devices retain data even when power is removed.

Current mass storage devices are relatively inexpensive and high density, providing reliable long term data storage relatively cheap. Such mass storage devices are, however, physically large and contain numerous moving parts, which reduces the reliability of the devices. Moreover, existing mass storage devices are relatively slow, which slows the operation of the computer system or other electronic device containing the mass storage device. As a result, other technologies are being developed to provide long term nonvolatile data storage, and, ideally, such technologies would also be fast and cheap enough for use in system memory as well. The use of FLASH, which provides nonvolatile storage, is increasing popular in many electronic devices such as digital cameras. While FLASH provides nonvolatile storage, FLASH is too slow for use as system memory and the use of FLASH for mass storage is impractical, due in part to the duration for which the FLASH can reliably store data as well as limits on the number of times data can be written to and read from FLASH.

Due to the nature of existing memory technologies, new technologies are being developed to provide high density, high speed, long term nonvolatile data storage. One such technology that offers promise for both long term mass storage and system memory applications is Magneto-Resistive or Magnetic Random Access Memory (MRAM). FIG. 1 is a functional diagram showing a portion of a conventional MRAM array 100 including a plurality of memory cells 102 arranged in rows and columns. Each memory cell 102 is illustrated functionally as a resistor since the memory cell has either a first or a second resistance depending on a magnetic dipole orientation of the cell, as will be explained in more detail below. Each memory cell 102 in a respective row is coupled to a corresponding word line WL, and each memory cell in a respective column is coupled to a corresponding bit line BL. In FIG. 1, the word lines are designated WL1–3 and the bit lines designated BL1–4, and may hereafter be referred to using either these specific designations or generally as word lines WL and bit lines BL. Each of the memory cells 102 stores information magnetically in the form of an orientation of a magnetic dipole of a material forming the memory cell, with a first orientation of the magnetic dipole corresponding to a logic "1" and a second orientation of the magnetic dipole corresponding to a logic "0." The orientation of the magnetic dipole of each memory cell 102, in turn, determines a resistance of the cell. Accordingly, each memory cell 102 has a first resistance when the magnetic dipole has the first orientation and a second resistance when the magnetic dipole has the second orientation. By sensing the resistance of each memory cell 102, the orientation of the magnetic dipole and thereby the logic state of the data stored in the memory cell 102 can be determined.

To write data to a selected memory cell 102, a row current IROW is applied to the word line WL coupled to the cell and a column current ICOL is applied to the bit line BL coupled to the cell. The row current IROW and column current ICOL generated respective magnetic fields, with only the selected memory cell 102 being subjected to both the magnetic field generated by the row current and the magnetic field generated by the column current. The combination of these magnetic fields applied to the selected memory cell 102 sets the orientation of the magnetic dipole and thereby the resistance of the cell, which writes a data bit corresponding to either a logic 1 or 0 into the cell.

To read data from the MRAM array 100, the resistance of a selected memory cell 102 must be sensed. In one method of sensing the resistance of a selected memory cell 102, a reference voltage VA is applied to the word line WL coupled to the cell, and all other word lines and unselected bit lines BL are coupled to ground. FIG. 1B is a schematic illustrating the equivalent circuit of the MRAM array 100 when the memory cell 102 coupled to the word line WL2 and bit line BL3 is selected. In this situation, the reference voltage VA is applied to the selected word line WL2, and all other word lines WL1, WL3 and unselected bit lines BL1, BL2, BL4 are coupled to ground. The resistance of the selected memory cell 102 is represented by the resistance RSC, which is coupled between word line WL2 and bit line BL3. All unselected memory cells 102 coupled to the selected bit line BL3 are coupled between the bit line BL3 and the unselected word lines WL1, WL3, which are coupled to ground, and these unselected memory cells collectively form a "sneak" resistance RSN. All other unselected memory cells 102 in the array 100 do not affect the equivalent circuit since both ends of these memory cells are coupled to ground via the unselected word lines WL1, WL3, and bit lines BL1, BL2, and BL4, as will be appreciated by those skilled in the art.

In response to the applied reference voltage VA, a read current IR flows through the resistance RSC presented by the selected memory cell 102 and through the sneak resistance RSN to ground. The current IR generates a sense voltage SV on the selected bit line BL3, with the magnitude of this voltage being a function of the magnitude of the resistance RSC of the selected memory cell 102. When the resistance RSC has a larger value, the sense voltage SV on the bit line BL3 will be less than when the resistance RSC has a smaller value. Accordingly, the sense voltage SV has a value indicating the magnitude of the resistance RSC and thus indicating the logic state of the data stored in the selected memory cell 102.

In theory, sensing the resistance value of a selected memory cell 102 to read the logic state of data stored in the cell is simple as just described. In practice, however, reliable sensing is difficult due, in part, to the relatively small change in the resistance of the memory cell 102 between logic states. For example, in a typical MRAM array, each memory cell 102 has a resistance of about 1 Megaohm when the cell stores a logic "1" and a resistance of about 1.1 Megaohms when the cell stores a logic "0." The differential resistance of the selected memory cell 102 between a logic "1" and a logic "0" is thus only about 100 KΩ or approximately 10%. As a result, the sense voltage SV developed on the bit line BL3 varies by this same amount, making it difficult to reliably detect the sense voltage and determine whether a selected memory cell 102 stores a logic 1 or 0, as will be appreciated by those skilled in the art.

FIG. 2 is a functional block diagram illustrating an existing type of read circuit 200 for sensing the resistance values and thereby reading data from the memory cells 102 in the MRAM array 100 of FIG. 1. In FIG. 2, the same selected memory cell 102 discussed with reference to FIG. 1B is assumed to be selected and thus the equivalent circuit of FIG. 1B is shown as providing sense voltage SV as an input to the read circuit 200. A sense amplifier 202 receives the sense voltage SV from the selected bit line BL3 and generates a pulse clocking signal PCLK which has a frequency of pulses that is a function of the value of the sense voltage SV. A counter 204 receives the PCLK signal and generates a sense count SCNT responsive to each pulse of the PCLK signal. The counter 204 applies the SCNT count to a latch 206 which latches the SCNT count responsive to a latch count signal LC from a reference counter 208. The reference counter 208 is clocked by an applied clock signal CLK and activates the LC signal when an internal count equals a predetermined value, which occurs after a predetermined number of cycles of the CLK signal and thus after a predetermined time T. In this way, the reference counter 208 activates the LC signal to latch the SCNT every T seconds. The counter 204 resets the SCNT count responsive to the LC signal going active. A comparator 210 compares the latched SCNT from the latch 206 to a reference count RCNT and generates a data signal D responsive to this comparison. The RCNT count has a value corresponding to a threshold value for the resistance of the selected memory cell 102. When the SCNT is greater than the RCNT count, the comparator 210 drives the data signal D high, and when the SCNT count is less than the RCNT count the comparator drives the data signal low.

In operation, the resistance RSC corresponding to the selected memory cell 102 and the sneak resistance RSN form a voltage divider, and develop the sense voltage SV on the selected bit line BL3 in response to the voltage VA applied to the selected word line WL2. The sense amplifier 202 generates the PCLK signal having a frequency determined by the value of the sense voltage SV. When the sense voltage SV has a first value corresponding to a first logic state, the PCLK signal has a first number of pulses over a given time period, and when the sense voltage has a second value corresponding to the complementary logic state, the PCLK signal has a second number of pulses over the time period. Initially, the SCNT count generated by the counter 204 the internal count of the reference counter 208 are set to 0 and the LC signal generated by the reference counter is inactive. In response to each pulse of the PCLK signal, the counter 204 increments the SCNT count, and at the same time the reference counter 208 increments the internal count in response to each rising-edge of the CLK signal.

The counter 204 continues incrementing the SCNT count in response to pulses of the PCLK signal. Because the PCLK signal has a frequency determined by the value of the sense voltage SV which, in turn, is determined by the resistance of the selected memory cell 102, the SCNT count is incremented at a rate determined by the resistance of the selected memory cell. At the same time, the reference counter 208 increments the internal count responsive to the CLK signal. The counters 204, 208 continue incrementing their respective counts in response to the PCLK and CLK signals until the internal count generated by the reference counter equals a predetermined value. The reference counter 208 increments the internal count once each cycle of the CLK signal, and thus the internal count equals a predetermined value after a predetermined number of cycles of the CLK signal, which occurs after a predetermined time T. Once the internal count of the reference counter 208 equals the predetermined value, the counter activates the LC signal causing the latch 206 to store the SCNT count at this point. The rate at which the SCNT count is incremented and thus the value of the latched SCNT count depends on the frequency of the PCLK signal which, in turn, depends on the value of the sense voltage SV. In this way, the counter 204 increments the SCNT count responsive to the PCLK signal for the time T, and at this point the value of the SCNT count is stored by the latch 206 and provided to the comparator 210.

The comparator 210 compares the latched SCNT count to the reference count RCNT and drives the signal D either high or low depending on this comparison. When the latched SCNT count has a value that is less than the RCNT count, the sense voltage SV and thus the resistance RSC of the selected memory cell 102 corresponds to a first logic state and the comparator 210 drives the data signal D low, indicating the selected memory cell stores the first logic state. In contrast, when the latched SCNT count is greater than the RCNT count, the sense voltage and resistance RSC of the selected memory cell 102 correspond to the complementary logic state, and the comparator 210 drives the data signal D high, indicating the selected memory cell stores the complementary logic state.

In the read circuit 200, the digital counts SCNT and RCNT are compared to ultimately determine the logic state of data stored in a selected memory cell 102. As a result, the SCNT count must include enough bits and must be incremented at a sufficient rate responsive to the PCLK signal to ensure the generated RCNT has the desired resolution to enable the logic state of the selected memory cell 102 to be reliably sensed, as will be understood by those skilled in the art. Moreover, the circuitry required to form the counter 204 and comparator 210 will be relatively more complicated due to the need to generate and compare all bits in the RCNT and RCNT counts. In addition, with the read circuit 200 the SCNT count corresponding to a give logic state may vary among cells 102 in the array 100 (FIG. 1) due to variations in electrical characteristics among the cells resulting from the physical construction of the array. As a result, the RCNT may ideally need to be varied depending on which cell 102 is being selected, which further complicates the circuitry of the read circuit 200. Although the above description focuses on MRAM technology, the concepts and principles are equally applicable to other types of resistive memory technologies.

There is a need for a simplified method and system for sensing the resistance value of resistive memory cells such as MRAM cells to reliably read data from the cells.

SUMMARY OF THE INVENTION

According to one aspect of the present invention, a method of sensing data stored in a selected resistive memory cell includes generating a first count representing the logic state of an unknown initial data bit stored in the selected memory cell. A second count is generated and represents a data bit having a first known logic state stored in the selected memory cell. A third count is generated and represents a data bit having a second known logic state stored in the selected memory cell. The logic state of the initial unknown data bit stored in the selected memory cell is then determined from the first, second, and third counts.

DETAILED DESCRIPTION OF THE INVENTION

Figure 1A:
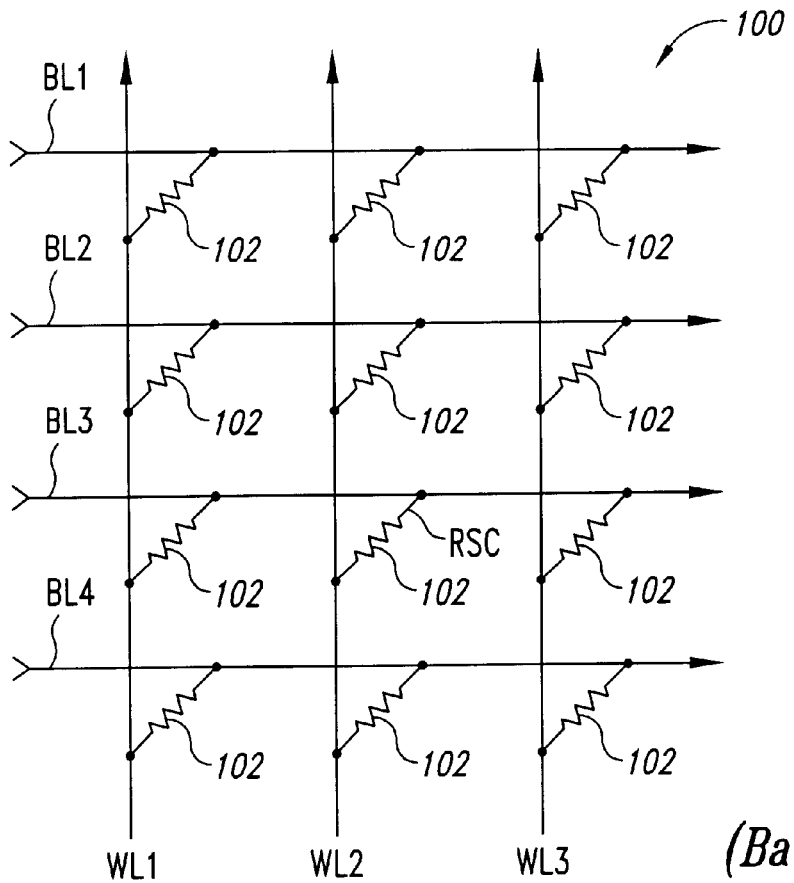
FIG. 1A is a functional diagram showing a portion of a conventional MRAM array including a plurality of memory cells arranged in rows and columns.
Figure 1B:
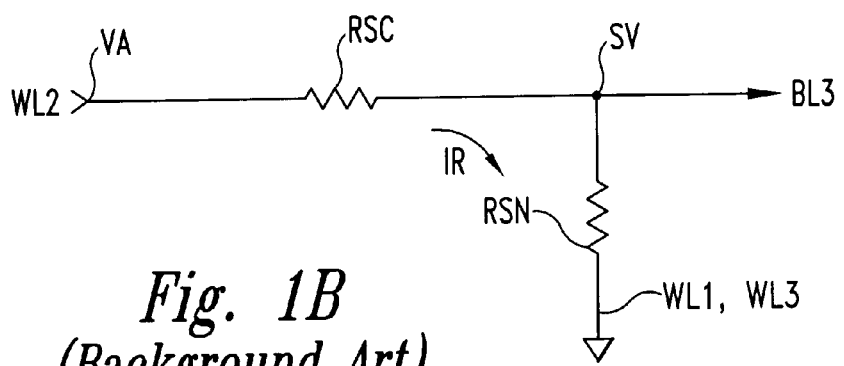
FIG. 1B is a schematic illustrating the equivalent circuit for the MRAM array of FIG. 1A when a particular memory cell is selected during a read operation.
Figure 2:
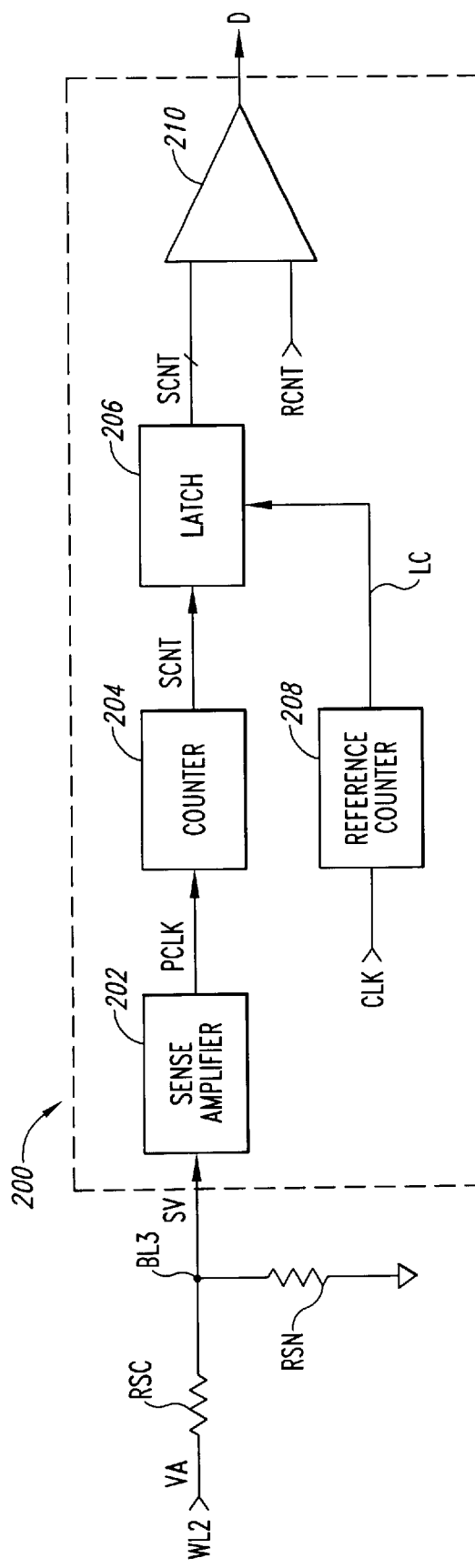
FIG. 2 is a functional block diagram illustrating a known type of read circuit for sensing the resistance values and thereby reading data from the memory cells in the MRAM array of FIG. 1.
Figure 3:
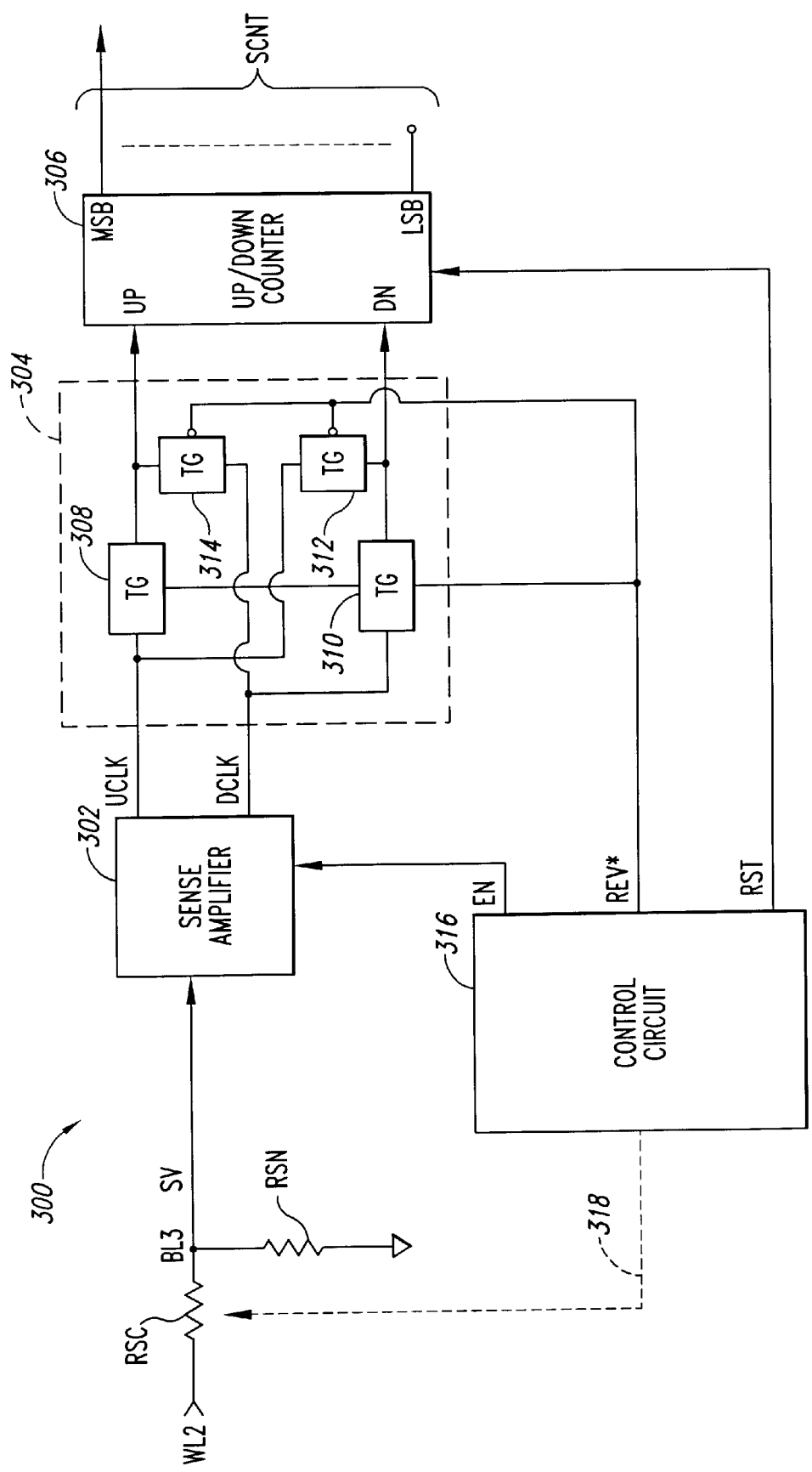
FIG. 3 is a functional block diagram illustrating a read circuit for sensing the resistance values and thereby reading data from the memory cells in the MRAM array of FIG. 1 according to one embodiment of the present invention.

FIG. 3 is a functional block diagram illustrating a read circuit 300 that generates a sense count SCNT having a most significant bit (MSB) corresponding to the logic state of the data stored in a selected memory cell 102 in the MRAM array 100 of FIG. 1 according to one embodiment of the present invention. In contrast to the prior data circuit 200 of FIG. 2, which generates an N-bit count SCNT that must then be compared to another N-bit reference count RCNT to determine the logic state of the data stored in a selected memory cell 102, the read circuit 300 generates single N-bit count SCNT having a single MSB bit indicating the logic state of data stored in the selected memory cell, as will be explained in more detail below. By eliminating the need to utilize the reference count RCNT and the need to compare two N-bit counts, the data circuit 300 provides a simplified and reliable circuit for reading data from MRAM memory cells. In the following description, certain details are set forth to provide a sufficient understanding of the present invention. However, it will be clear to one skilled in the art that the present invention may be practiced without these particular details. In other instances, well-known circuits and their operation have not been shown or described in detail to avoid unnecessarily obscuring the present invention.

In the read circuit 300, the same memory cell 102 discussed with reference to FIG. 1B is once again assumed to be selected, and thus the equivalent circuit of FIG. 1B is shown as providing the sense voltage SV as an input to the read circuit. A sense amplifier 302 receives the sense voltage SV from the selected bit line BL3 and generates an up clocking signal UCLK and a down clocking signal DCLK in response to the sense voltage. The sense amplifier 302 pulses either the UCLK or DCLK signal depending on the value of the sense voltage SV. When the sense voltage SV has a value greater than a threshold voltage, the sense amplifier 302 pulses the UCLK signal, and, conversely, when the sense voltage is less than the threshold voltage the sense amplifier pulses the DCLK signal. The sense amplifier 302 operates in this manner when an applied enable signal EN is active, and terminates generation of the UCLK and DCLK signals regardless of the applied sense voltage SV when the enable signal is inactive.

The value of the sense voltage SV varies around the threshold voltage due to inherent noise on the bit line BL3 and the small magnitude of the sense voltage, as will be appreciated by those skilled in the art. Thus, the sense amplifier 302 generates a series of UCLK, DCLK signal pulses, with the number of pulses of the UCLK signal and the number of pulses of the DCLK signal over a sensing time T being determined by the value of the sense voltage SV. When the sense voltage SV is greater than the threshold voltage, the sense amplifier 302 generates UCLK signal pulses and when the sense voltage is less than the threshold voltage the sense amplifier generates DCLK signal pulses. In the embodiment of FIG. 3, the resistance RSC of the selected memory cell 102 is assumed to have a value of approximately 1 Megaohm when the cell stores a logic 1, and a value of approximately 1.1 Megaohms when the cell stores a logic 0. As a result, the sense voltage SV has a larger value when the selected memory cell 102 stores a logic 1 and when the cell stores a logic 0. Thus, when the selected memory cell 102 stores a logic 1 the sense amplifier 302 will generate more UCLK signal pulses than DCLK signal pulses over the sensing time T.

The UCLK, DCLK signal pulses are applied through a switching circuit 304 to clock and up/down counter 306 which generates an N-bit sense count SCNT in response to the applied signal pulses. The SCNT count of the counter 306 is initially set to an initial value IV, which is thereafter incremented in response to UCLK signal pulses applied to an up input UP of the counter, and is decremented in response to DCLK signal pulses applied to a down input DN of the counter, as will be described in more detail below. The switching circuit 304 includes a plurality of transmission gates 308–314 coupled as shown between the sense amplifier 302 and the up/down counter 306. The transmission gates 308–314 operate in response to a reverse signal REV* from a control circuit 316 to either apply the UCLK and DCLK signals to the UP and DN inputs, respectively, of the counter 306, or to reverse the UCLK and DCLK signals and apply the UCLK signal to the DN input and the DCLK signal to the UP input. When the REV* signal is inactive high, the transmission gates 312, 314 turn OFF and the transmission gates 308, 310 turn ON, applying the UCLK signal to the UP input and the DCLK signal to the DN input, respectively, of the counter 306. In contrast, when the REV*signal is active low, the transmission gates 308,310 turn OFF and the transmission gates 312, 314 turn ON, applying the UCLK signal to the DN input and the DCLK signal to the UP input, respectively, of the counter 306.

In addition to the REV* signal, the control circuit 316 also generates a plurality of control signals 318 to control the logic state of data stored in the selected memory cell 102 represented by the resistance RSC, as will be explained in more detail below. The control circuit 316 also generates a reset signal RST that is applied to the counter 306 to set the SCNT count to the initial value IV and an enable signal EN is applied to the sense amplifier 302 to enable operation of the sense amplifier. One skilled in the art will understand circuitry for forming the sense amplifier 302, transmission gates 308–314, counter 306, and control circuit 316, and thus, for the sake of brevity, these components will not be described in more detail.

In operation, the read circuit 300 operates under control of the control circuit 316 to sense the logic state of data stored in the selected memory cell 102 represented by the resistance RSC, as will now be explained in more detail with reference to FIG. 3 and the flowchart of FIG. 4, which illustrates the process executed by the read circuit 300 in sensing the data stored in the selected memory cell. The process begins in step 400 and proceeds immediately step 402, in which the control circuit 316 activates the RST signal to cause the counter 306 to reset the SCNT count to the initial value IV. The initial value IV is defined by the most significant bit MSB of the SCNT count being a 1 and all other bits being a 0. For example, if the SCNT count is 10 bits, the initial value IV equals "1000000000" with the leftmost "1" being the MSB. The control circuit 316 also activates the EN signal to enable the sense amplifier 302, and drives the REV* signal inactive high to turn ON transmission gates 308, 310 and apply the UCLK, DCLK signals to the UP, DN inputs of the counter 306.

From step 402, the process proceeds to step 404 and the control circuit 316 accesses the selected memory cell 102 corresponding to the resistance RSC. In accessing the selected memory cell 102, the control circuit 316 controls the MRAM array 100 (FIG. 1) as previously described to develop the sense voltage SV on the bit line BL3. As previously discussed, the sense voltage SV has a value determined by the resistance RSC, which corresponds to the data stored in the selected memory cell 102. Note that at this point, it is unknown whether the selected memory cell 102 represented by the resistance RSC stores a logic 1 or logic 0. The sense amplifier 302 receives the sense voltage SV and pulses either the UCLK or DCLK signal depending on the value of the sense voltage SV. As previously described, if the sense voltage SV is greater than a threshold voltage the sense amplifier 302 pulses the UCLK signal, and if the sense voltage is less than the threshold voltage the sense amplifier pulses the DCLK signal. Each UCLK signal pulse is applied through the transmission gate 308 to the UP input of the counter 306, incrementing the SCNT count responsive to each such pulse. Each DCLK signal pulse is applied through the transmission gate 3108 to the DN input of the counter 306, which decrements the SCNT count responsive to each such pulse.

The read circuit 300 continues operating in step 404 for the time 2T, at which time the SCNT count generated by the counter 306 has a value that differs from the initial value IV by the net of the number of UCLK signal pulses received and the number of DCLK signal pulses receive. For example, when a logic 1 is stored in the selected memory cell 102, the sense amplifier 302 may generate 251 UCLK signal pulses and 249 DCLK signal pulses during each time T. Thus, after each time T, the net of the UCLK and DCLK signal pulses causes the counter 306 to increment the SCNT count by 2 (251 up pulses minus 249 down pulses equals a net of 2 up pluses). In this situation, after the time 2T the counter 306 as incremented the initial value IV of the SCNT count by 4 to IV+4. To illustrate another example, assume that when a logic 0 is stored in the selected memory cell 102, the sense amplifier 302 generates 245 UCLK signal pulses and 255 DCLK signal pulses each time T. In this situation, after each time T the counter 306 decrements the SCNT count by 10 (245 up pulses minus 255 down pulses equals a net of 10 down pulses), and thus after the time 2T the counter as decremented the SCNT count from the initial value IV to the value IV-20. Note that in this example, the number of UCLK signal pulses is greater when the selected memory cell 102 stores a logic 1 than when the cell stores a logic 0 because the sense voltage SV is greater in the former situation, as previously discussed.

After the time 2T, the process proceeds to step 406 and the control circuit 316 drives the EN signal inactive, disabling the sense amplifier 302 so that the counter 306 maintains the SCNT count at the value generated after the time 2T, which was IV+4 in the case of a logic 1 being sensed in the example set forth above. At this point, the control circuit 316 also drives the REV* signal active low, turning OFF transmission gates 308, 310 and turning ON transmission gates 312, 314. As a result, the UCLK signal pulses are now applied to the DN input of the counter 306 and the DCLK signal pulses applied to the IN input. From step 406 the process proceeds to step 408 and the control circuit 316 generates the control signals 318 to write a logic 1 into the selected memory cell 102 represented by the resistance RSC. As previously mentioned, the resistance RSC has a value of approximately 1 Megahom when storing a logic 1.

After storing a logic 1 in the selected memory cell 102, the process goes to step 410 and the control circuit 316 activates the EN signal to enable the sense amplifier 302. The sense amplifier 302 thereafter operates as previously described to generate the UCLK and DCLK signal pulses in response to the sense voltage SV corresponding to the logic 1 now stored in the selected memory cell 102. Note that the active REV* signal causes the switching circuit 304 to apply the UCLK and DCLK signal pulses to the DN and UP inputs, respectively, of the counter 306, which is the reverse of the prior situation during the initial sensing time 2T. The control circuit 316 maintains the EN signal active for the time T, and thus the sense amplifier 302 detects the sense voltage SV corresponding to the known logic 1 in the selected memory cell 102 and generates the corresponding UCLK and DCLK signal pulses for the time T.

Because the UCLK and DCLK signal pulses are applied to opposite inputs DN, UP of the counter 306, the counter decrements the value of the SCNT count in response to each UCLK signal pulse and increments the value of the SCNT count in response to each DCLK pulse. As a result, the counter 306 adjusts the value of the SCNT count after the time T to remove a portion of the net count that would have been included in the SCNT count if a logic 1 was being sensed during the initial time 2T. In the example described above, after each time T the SCNT count is incremented by 2 if a logic 1 was stored in the selected memory cell 102 to a value IV+4 after the time 2T. Thus, after the time T with the counter 306 operating in the reverse direction, the counter 306 will have decremented the SCNT count by 2. The counter 306 thus decrements the SCNT count by 2 after each time T instead of incrementing the count by 2 due to the UCLK and DCLK signal pulses being applied to opposite inputs DN, UP of the counter. Note that if the unknown data bit stored in the selected memory cell 102 during the initial time 2T was a logic 0, the counter 306 nonetheless decrements the SCNT count by 2 after the time T with the counter operating in the reverse direction.

After the sense amplifier 302 has sensed the known logic 1 for the time T, the process goes to step 412 and the control circuit 316 drives the EN signal inactive, disabling the sense amplifier 302 so that the counter 306 maintains the SCNT count at the value generated at the end of the last time T. At this point, the control circuit 316 maintains the REV* signal active low. From step 412 the process proceeds to step 414 and the control circuit 316 generates the control signals 318 to write a logic 0 into the selected memory cell 102 represented by the resistance RSC. As previously mentioned, the resistance RSC has a value of approximately 1.1 Megahoms when storing a logic 0. After storing a logic 0 in the selected memory cell 102, the process goes to step 416 and the control circuit 316 once again activates the EN signal to enable the sense amplifier 302. The sense amplifier 302 thereafter operates as previously described to generate the UCLK and DCLK signal pulses in response to the sense voltage SV corresponding to the logic 0 now stored in the selected memory cell 102. Note that the active REV* signal once again causes the switching circuit 304 to apply the UCLK and DCLK signal pulses to the DN and UP inputs, respectively, of the counter 306, which once again cause the counter 306 to operate the reverse of the operation during the initial sensing time 2T. The control circuit 316 once maintains the EN signal active for the time T, and thus the sense amplifier 302 detects the sense voltage SV corresponding to the known logic 0 in the selected memory cell 102 and generates the corresponding UCLK and DCLK signal pulses for the time T.

Because the UCLK and DCLK signal pulses are once again applied to opposite inputs DN, UP of the counter 306, the counter adjusts the value of the SCNT count to remove a portion of the net count that would have been included in the SCNT count if a logic 0 was being sensed during the initial time 2T. In the example described above, after each time T the SCNT count is decremented by 10 if a logic 0 was stored in the selected memory cell 102. Thus, after the time T with the counter 306 operating in the reverse direction, the counter 306 will have incremented the SCNT count by 10. The counter 306 thus increments the SCNT count by 10 after each time T instead of decrementing the count by 10 due to the UCLK and DCLK signal pulses being applied to opposite inputs DN, UP of the counter.

After the sense amplifier 302 has sensed the known logic 0 for the time T, the process goes to step 418 and the control circuit 316 drives the EN signal inactive, disabling the sense amplifier 302 so that the counter 306 maintains the SCNT count at the value generated at the end of the last time T. At this point, the most significant bit MSB of the SCNT count corresponds to a logic state of the data initially stored in the selected memory cell 102. Thus, if the most significant bit MSB is a logic 1, the selected memory cell 102 initially stored in a logic 1. Conversely, if the most significant bit MSB is a logic 0, the selected memory cell 102 initially stored a logic 0. The counter 306 provides the most significant bit MSB as the output of the read circuit 300. From step 418, the process goes to step 420 and the control circuit 316 determines whether the most significant bit MSB of the SCNT count equals a logic 0, which indicates the selected memory cell 102 initially stored a logic 0. Note that at this point the selected memory cell 102 stores a logic 0 because the control circuit 316 wrote a logic 0 to the selected memory cell in step 414. As a result, if the selected memory cell 102 initially stored a logic 0, the process proceeds immediately to step 422 and terminates since the selected memory cell properly stores a logic 0. In contrast, if the control circuit 316 determines the most significant bit MSB of the SCNT count equals a logic 1, meaning the selected memory cell initially stored a logic 1, the process goes to step 424 and the control circuit rights a logic 1 to the selected memory cell to restore the cell to its proper initial logic state. From step 424, the process than goes to step 422 and terminates.

The read circuit 300 senses an unknown bit stored in a selected memory cell 102 for a time 2T and generates a corresponding SCNT count. The SCNT count generated after the time 2T will have a unique value depending on whether the selected memory cell 102 stores a logic 1 or a logic 0. After the time 2T, the value of the SCNT count is twice what the value would have been after the time T, with the precise value of the SCNT count being determined by whether the selected memory cell 102 stores a logic 1 or 0. After having generated this value of the SCNT count corresponding to the unknown bit stored in the selected memory cell 102, the read circuit 300 subtracts count values corresponding to a known logic 1 and a known logic 0 stored in the selected memory cell. By subtracting the count values for a known logic 1 and 0, and knowing that a logic 1 stored in a selected memory cell 102 generates more UCLK signal pulses than a logic 0, the read data circuit generates the SCNT count having the MSB bit indicating the logic state of data stored in the selected memory cell 102. To provide a better understanding of the operation of the read circuit 300, an example will now be discussed with reference to Table 1 set forth below.

TABLE 1

(Logic 1 = 251 UCLK, 249 DCLK; Logic 0 = 245 UCLK, 255 DCLK)

| Time | Sensed Bit | SCNT Count | Decimal Value |
|---|---|---|---|
| Start | | 1000000000 | 512 |
| T | Unknown "1" | 1000000010 | 514 |
| T | Unknown "1" | 1000000100 | 516 |
| Switch UP and DN | | | |
| T | Known "1" | 1000000010 | 514 |
| T | Known "0" | 1000001100 | 524 |

Table 1 illustrates the SCNT counts generated by counter 306 in the read circuit 300 after respective times T whether a logic 1 and 0 stored in the selected memory cell 102 have the specified characteristics. More specifically, in the example illustrated in Table 1, when the selected memory cell 102 stores a logic 1 the sense amplifier 302 generates 251 UCLK signal pulses and 249 DCLK signal pulses each time T, and when the cell stores a logic 0 the sense amplifier generates 245 UCLK signal pulses and 255 DCLK signal pulses each time T. In Table 1, the far left column represents time intervals and the next column to the right represents the logic state of the bit stored in the selected memory cell 102 that is being sensed. The next column to the right represents the binary values of the SCNT count, and the far right column represents the decimal value of the corresponding binary SCNT count.

As illustrated in Table 1, the SCNT count is initially set to a binary value of 1000000000, which corresponds to a decimal value 512. After sensing the unknown bit stored in the selected memory cell 102 for the time T, which is a logic 1 in the example of Table 1, the SCNT count has a binary value of 1000000010 or decimal value 514. After sensing the unknown bit for a second time T, the SCNT count has a binary value of 1000000100 and a decimal value of 516. At this point, the operation of the counter 306 is reversed as indicated in Table 1, which corresponds to the point at which the control circuit 316 activates the REV* signal, as previously described. A known logic 1 is stored in the selected memory cell 102 at this point and then sensed for the time T. After the time T, the SCNT count has the binary value of 1000000010 corresponding to 514 decimal. Thus, during the third sensing time T, the count of 2 added to the SCNT count during the second sensing time T is subtracted due to the reverse operation of the counter 306. At this point, a known logic 0 is stored in the selected memory cell 102 and is sensed for the time T. After this time T, the SCNT count has the binary value 1000001100 which equals 524 decimal. At this point, the MSB bit of the SCNT count indicates the logic state of the unknown bit stored in the selected memory cell 102, which equals a logic 1 in this example.

Another example of the operation of the read circuit 300 will now be described with reference to Table 2 set forth below.

TABLE 2

(Logic 1 = 251 UCLK, 249 DCLK; Logic 0 = 245 UCLK, 255 DCLK)

| Time | Sensed Bit | SCNT Count | Decimal Value |
|---|---|---|---|
| Start | | 1000000000 | 512 |
| T | Unknown "0" | 0111110110 | 502 |
| T | Unknown "0" | 0111101100 | 492 |
| Switch UP and DN | | | |
| T | Known "1" | 0111101010 | 490 |
| T | Known "0" | 0111110100 | 500 |

Table 2 illustrates the SCNT counts generated by counter 306 in the read circuit 300 after respective times T whether a logic 1 and 0 stored in the selected memory cell 102 have the specified characteristics. More specifically, in the example illustrated in Table 2, when the selected memory cell 102 stores a logic 1 the sense amplifier 302 generates 251 UCLK signal pulses and 249 DCLK signal pulses each time T, and when the cell stores a logic 0 the sense amplifier generates 245 UCLK signal pulses and 255 DCLK signal pulses each time T. In Table 2, the far left column represents time intervals and the next column to the right represents the logic state of the bit stored in the selected memory cell 102 that is being sensed. The next column to the right represents the binary values of the SCNT count, and the far right column represents the decimal value of the corresponding binary SCNT count.

As illustrated in Table 2, the SCNT count is initially set to a binary value of 1000000000, which corresponds to a decimal value 512. After sensing the unknown bit stored in the selected memory cell 102 for the time T, which is a logic 0 in the example of Table 2, the SCNT count has a binary value of 0111110110 or decimal value 502. After sensing the unknown bit for a second time T, the SCNT count has a binary value of 0111101100 and a decimal value of 492. At this point, the operation of the counter 306 is reversed as indicated in Table 2, which corresponds to the point at which the control circuit 316 activates the REV* signal, as previously described. A known logic 1 is stored in the selected memory cell 102 at this point and then sensed for the time T. After the time T, the SCNT count has the binary value of 0111101010 corresponding to 490 decimal. At this point, a known logic 0 is stored in the selected memory cell 102 and is sensed for the time T. After this time T, the SCNT count has the binary value 0111110100 which equals 500 decimal. At this point, the MSB bit of the SCNT count indicates the logic state of the unknown bit stored in the selected memory cell 102, which equals a logic 0 in this example.

As illustrated by the examples of Tables 1 and 2, the MSB bit of the SCNT count equals a logic state of the unknown bit stored in the selected memory cell 102. This can be understood by realizing that when the SCNT count is set to the initial value IV of 1000000000, the net of the UCLK and DCLK signal pulses applied to the counter 306 in both the normal and reverse modes of operation results in this initial value being incremented when the selected memory cell 102 stores a logic 1. As a result, the MSB bit of the SCNT count will remain a logic 1 in this situation. In contrast, when the SCNT count is set to the initial value IV of 1000000000, the net of the UCLK and DCLK signal pulses applied to the counter 306 in both the normal and reverse modes of operation results in this initial value being decremented when the selected memory cell 102 stores a logic 0. Accordingly, when the initial value IV is decremented, the MSB bit changes to a logic 0 and thus correctly indicates the data bit stored in the selected memory cell 102.

The operation of the read circuit 300 may alternately be understood in the following terms. Assume that a logic 1 results in a net increase of the SCNT count by a value of X when sensed over a time T, and that a logic 0 results in a net change Y when sensed over the time T, where Y may be a net increase or decrease but where Y is less than X. In this situation, if the SCNT count has the initial value IV, then after 2T the SCNT count will have a value of either IV+2X or IV+2Y, depending on whether the sensed bit is a logic 1 or 0. If the values X and Y are then subtracted from the either IV+2X or IV+2Y, then a final value of the SCNT count will equal either a first final value FV1=IV+2X−X−Y or a second final value FV2=IV+2Y−X−Y. The first final value FV1=IV+X−Y, and since X>Y then FV1>IV. Thus, when the sensed bit is a logic 1, the SCNT count will have the value FV1, which is greater than IV. This means that if the initial value IV is selected with the MSB bit being a 1, then the MSB bit will equal a 1 when the SCNT count has the value FV1. Conversely, the second final value FV2=IV+Y−X, and since X>Y then. FV2<IV. Thus, when the sensed bit is a logic 0, the SCNT count will have the value FV2, which is less than IV, meaning that if the initial value IV is selected with the MSB bit being a 1 then the MSB bit will be a 0 when the SCNT count has the value FV2.

Using these concepts to explain the specific operation of the read circuit 300 in the embodiment of FIG. 3, when a selected memory cell 102 stores a logic 1, the value of the SCNT count represents a logic 1 being sensed for the time 2T, which will equal a number greater than the initial value IV since a logic 1 includes more UCLK signal pulses than DCLK signal pulses. Accordingly, when the operation of the counter 306 is reversed, the known logic 1 subtracts ½ the value of the SCNT count after the time 2T. When the known logic 0 is sensed, the reverse operation of the counter 306 results in the SCNT count after the time 3T being incremented. As a result, the SCNT count is greater tha Conversely, when a selected memory cell 102 stores a logic 0, the value of the SCNT count represents a logic 0 being sensed for the time 2T, which will equal a number less than the initial value IV since a logic 0 includes more DCLK signal pulses than UCLK signal pulses. Accordingly, when the operation of the counter 306 is reversed, the known logic 0 adds ½ the value of the SCNT count after the time 2T. When the known logic 1 is sensed, the reverse operation of the counter 306 results in the SCNT count after the time being decremented, leaving the final value of the SCNT count at a value less than the initial value IV and thus leaving the MSB bit equal to 0. One skilled in the art will realize that if the situation is reversed and a logic 1 includes more DCLK signal pulses than UCLK signal pulses relative to a logic 0, the read circuit 300 may operate in the identical manner except that the MSB bit of the SCNT count now represents the complement of the logic state of the data bit stored in a selected memory cell 102.

The read circuit 300 generates the single MSB bit of the SCNT count to indicate the logic state of data stored in a selected memory cell 102. With the read circuit 300, there is no need to compare multiple N-bit count values to read data stored in a selected memory cell 102. Moreover, with the read circuit 300, there is no need to use a reference count RCNT, which will vary among selected memory cells 102. Instead, the read circuit 300 utilizes actual count values for a known a logic 1 and logic 0 stored in the selected memory cell 102 in detecting a logic state of an unknown bit stored in the selected memory cell. This eliminates the need for a reference count that must be used with multiple selected memory cells 102 even though the precise counts corresponding to a logic 1 and a logic 0 vary among the memory cells, which introduces uncertainty in determining whether a given memory cell stores a logic 1 or a logic 0, as will be appreciated by those skilled in the art.

Figure 5:
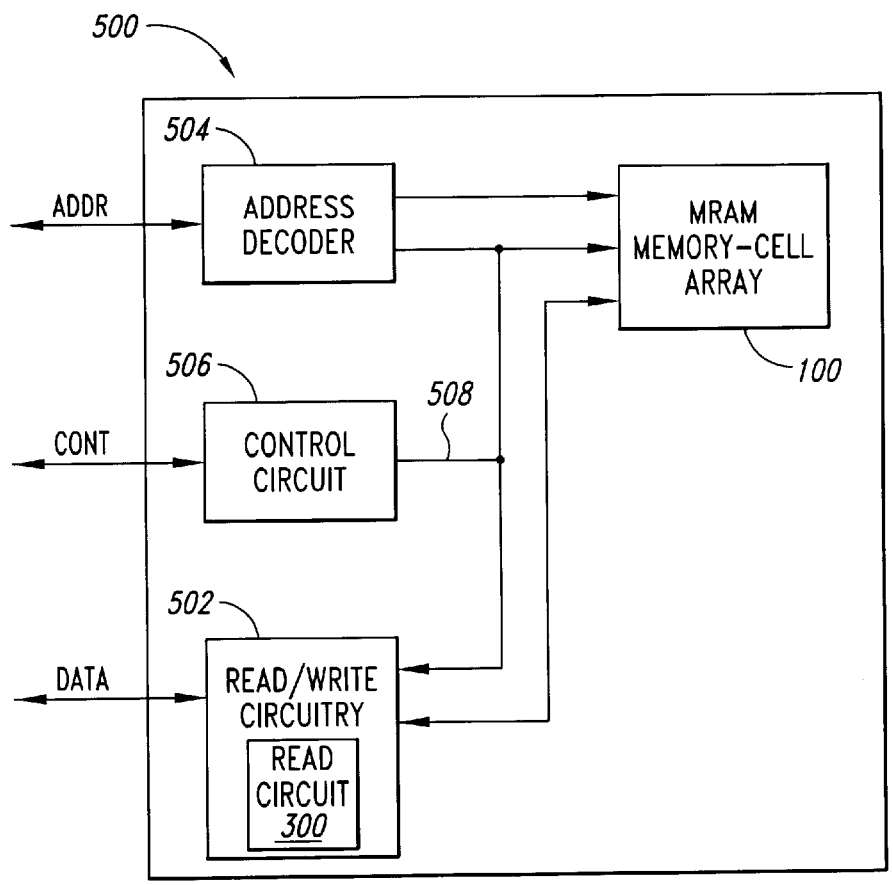
FIG. 5 is a functional block diagram of an MRAM including the read circuit of FIG. 3.

FIG. 5 is a simplified block diagram of a magnetic random access memory (MRAM) 500 including the read circuit 300 of FIG. 3 contained in a read/write circuit 502. The read/write circuit 502 is coupled to a resistive memory-cell array, which is shown as the MRAM array 100 of FIG. 1, and operates during write operations to transfer data on a data bus DATA to addressed memory cells 102 in the MRAM array. During read operations, the read circuit 300 operates as previously described to read data from addressed memory cells in the MRAM array 100, and the read/write circuit 502 places the read data onto the data bus DATA. The read/write circuit 502 also includes the circuitry for transferring a known logic 1 and 0 to selected memory cells 102 during read operations, as previously discussed with reference to the read circuit 300 of FIG. 3.

The MRAM 500 further includes an address decoder 504 that receives addresses from external circuitry (not shown), such as a processor or memory controller, on an address bus ADDR. In response to the received addresses, the address decoder 504 decodes the addresses and applies decoded address signals to access corresponding MRAM memory cells in the MRAM array 100. A control circuit 506 applies a plurality of control signals 508 to control the MRAM array 100, address decoder 504 and read/write circuit 502 during operation of the MRAM 500. The control circuit 316 (FIG. 3) of the data read circuit 300 may be contained in the control circuit 506, and thus the control signals 508 may include the REV*, EN, RST, and signals 318 discussed with reference to FIG. 3.

In operation, the external circuitry provides address, control, and data signals to the MRAM 500 over the respective ADDR, CONT, and DATA busses. During a write cycle, the external circuitry provides memory addresses on the ADDR bus, control signals on the CONT bus, and data on the DATA bus. In response to the control signals, the control circuit 506 generates controls signals 508, including the REV signal, to control the MRAM array 100, address decoder 504, and read/write circuitry 504. The address decoder 504 decodes the memory address on the ADDR bus and provides decoded address signals to select the corresponding memory cells in the MRAM array 100. The read/write circuitry 504 receives write data on the DATA bus, and applies the write data to the MRAM array 100 to store the data in the selected memory cells.

During a read cycle, the external circuitry provides a memory address on the ADDR bus and control signals on the CONT bus. Once again, in response to the control signals, the control circuit 506 generates controls signals 508 to control the MRAM array 100, address decoder 504, and read/write circuitry 504. In response to the memory address, the address decoder 504 provides decoded address signals to access the corresponding memory cells in the array 100. The read/write circuitry 504 provides data stored in the addressed memory cells onto the DATA bus to be read by the external circuit. One skilled in the art will understand circuitry for forming the address decoder 504, read/write circuitry 504, and control circuit 506, and thus, for the sake of brevity, these components are not described in more detail.

Although only the single array 100 is shown in the MRAM 500, the MRAM may include a plurality of arrays, and may also include additional components not illustrated in FIG. 5, as will be appreciated by those skilled in the art. Moreover, as previously mentioned, the MRAM 500 can include any type of resistive memory-cell array and is thus not limited to including MRAM arrays. In the MRAM 500, the read circuit 300 is shown as included in the read/write circuit 502, but one skilled in the art will realize portions of the read circuit could be included in the other components of the MRAM. For example, the control circuit 316 (FIG. 3) of the read circuit 300 could be included in the control circuit 506 of the MRAM 500.

Figure 6:
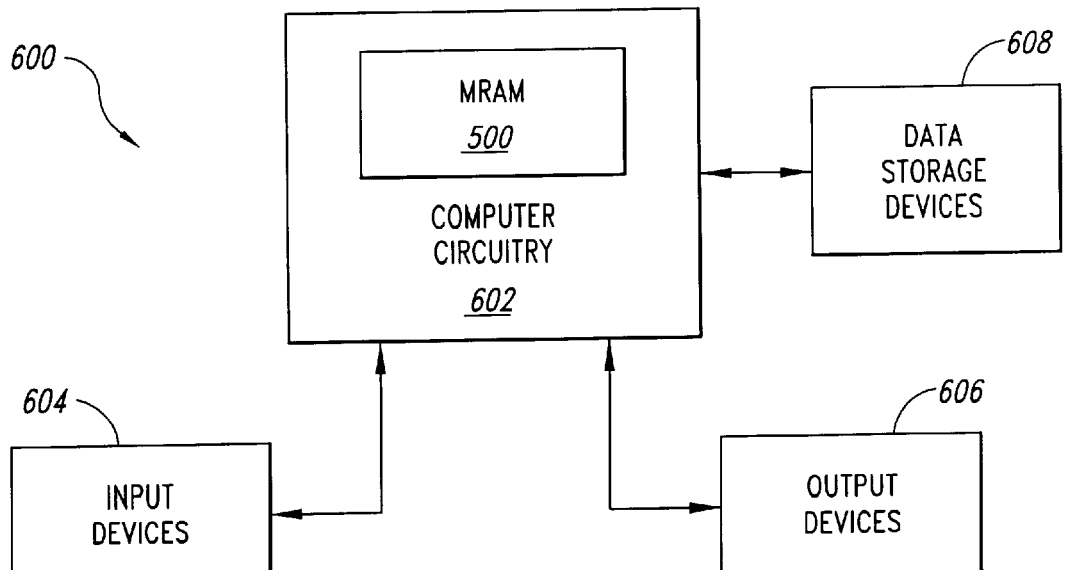
FIG. 6 is a functional block diagram of a computer system including computer circuitry containing the MRAM of FIG. 5.

FIG. 6 is a block diagram of a computer system 600 including computer circuitry 602 that contains the MRAM 500 of FIG. 5. The computer circuitry 602 performs various computing functions, such as executing specific software to perform specific calculations or tasks. In addition, the computer system 600 includes one or more input devices 604, such as a keyboard or a mouse, coupled to the computer circuitry 602 to allow an operator to interface with the computer system. Typically, the computer system 600 also includes one or more output devices 606 coupled to the computer circuitry 602, such output devices typically being a printer or video display. One or more data storage devices 608 are also typically coupled to the computer circuitry 602 to store data or retrieve data from external storage media (not shown). Examples of typical storage devices 608 include hard and floppy disks, tape cassettes, compact disc read-only memories (CD-ROMs), read-write CD ROMS (CD-RW), and digital video discs (DVDs). Moreover, although the MRAM 500 is shown as being part of the computer circuitry 602, the MRAM can also be used as a data storage device 608 since, as previously described, the nonvolatile nature and speed of the MRAM make it an attractive alternative to other storage media devices such as hard disks.

Even though various embodiments and advantages of the present invention have been set forth in the foregoing description, the above disclosure is illustrative only, and changes may be made in detail and yet remain within the broad principles of the invention. Therefore, the present invention is to be limited only by the appended claims.

What is claimed is:

1. A method of sensing data stored in a selected resistive memory cell, the method comprising:

generating a first count representing the logic state of an unknown initial data bit stored in the selected memory cell;

generating a second count representing a data bit having a first known logic state stored in the selected memory cell;

generating a third count representing a data bit having a second known logic state stored in the selected memory cell, generating the first, second, and third counts comprising applying a current through the selected resistive memory cell and sensing the voltage developed responsive to the applied current, generating a plurality of up count signals and down count signals responsive to the sensed voltage, and adjusting the count responsive to the up count and down count signals; and determining the logic state of the unknown initial data bit stored in the selected memory cell from the first, second, and third counts.

2. The method of claim 1 wherein determining the logic state of the unknown initial data bit stored in the selected memory cell from the first, second, and third counts comprises subtracting the second and third counts from the first count to generate a final count.

3. The method of claim 2 further comprising determining the unknown logic state from a most significant bit of the final count.

4. The method of claim 1 wherein the resistive memory cell comprises an MRAM memory cell.

5. The method of claim 1 wherein the first known logic state comprises a logic 1 and the second known logic state comprises a logic 0.

6. The method of claim 5 wherein the second count representing a data bit having the first known logic state is greater than the third count representing a data bit having the second known logic state.

7. The method of claim 1 wherein the first count is generated over a time period 2T and the second and third counts are each generated over a time period T.

8. The method of claim 1 wherein generating a first count representing the logic state of an unknown initial data bit stored in the selected memory cell comprises generating an interim count representing the logic state of the unknown initial data bit stored in the selected memory cell over a time T, and thereafter doubling the interim count to generate the first count.

9. A read circuit for sensing the logic state of a data bit stored in a resistive memory cell, the read circuit adapted to receive a sense voltage from a selected resistive memory cell, and the read circuit operable in a first mode to detect a first sense voltage corresponding to an unknown logic state and to generate an N-bit count responsive to the detected first sense voltage, operable in a second mode to detect a second sense voltage corresponding to a first known logic state and to adjust the count responsive to the detected second sense voltage, and operable in a third mode to detect a third sense voltage corresponding to a second known logic state and to adjust the count responsive to the detected third sense voltage, with a single bit of the N-bit count after the third mode representing the unknown logic state to the first sense voltage, the read circuit operable in the first mode for a time 2T and operable in each of the second and third times for a time T.

10. The read circuit of claim 9 wherein the most significant bit of the N-bit count after the third mode represents the logic state of the initial data bit corresponding to the first sense voltage.

11. The read circuit of claim 10 wherein the logic state of the most significant bit equals the logic state of the initial data bit corresponding to the first sense voltage.

12. The read circuit of claim 9 wherein the data circuit generates a plurality of up count signals and down count signals during each mode responsive to the respective sense voltages.

13. The read circuit of claim 12 wherein the data circuit operates during the first mode to increment the count responsive to each up count signal and to decrement the count responsive to each down count signal.

14. The read circuit of claim 12 wherein the data circuit operates during the second and third modes to decrement the count responsive to each up count signal and to increment the count responsive to each down count signal.

15. The read circuit of claim 9 wherein the resistive memory cell comprises an MRAM memory cell.

16. The read circuit of claim 9 wherein the read circuit sets the N-bit count to an initial value of the most significant bit being a logic 1 and all other bits being a logic 0 prior to operation in the first mode.

17. The read circuit of claim 9 further comprising a sense amplifier adapted to receive the sense voltages, a switching circuit coupled to the sense amplifier, and an up/down counter coupled to the switching circuit.

18. A memory device, comprising:
an address bus;
a control bus;
a data bus;
an address decoder coupled to the address bus;
a read/write circuit coupled to the data bus;
a control circuit coupled to the control bus;
a memory-cell array including a plurality of resistive memory cells, the array being coupled to the address decoder, control circuit, and read/write circuit; and
a read circuit coupled to the memory-cell array and read/write circuit for sensing the logic state of a data bit stored in a selected resistive memory cell in the array, the read circuit adapted to receive a sense voltage from the selected resistive memory cell and operable in a first mode to detect a first sense voltage for a first time and to generate an N-bit count responsive to the detected first sense voltage, operable in a second mode to detect a second sense voltage for a second time and to adjust the count responsive to the detected second sense voltage, and operable in a third mode to detect a third sense voltage for a third time and to adjust the count responsive to the detected third sense voltage, with the read circuit applying a single bit of the N-bit count to the read/write circuit after the third mode and the single bit representing the logic state of an initial data bit corresponding to the first sense voltage, the first time equal to 2T and the second and third times each equal to T.

19. The memory device of claim 18 wherein the memory device comprises an MRAM.

20. The memory device of claim 18 wherein the most significant bit of the N-bit count after the third mode represents the logic state of the initial data bit corresponding to the first sense voltage.

21. The memory device of claim 20 wherein the logic state of the most significant bit equals the logic state of the initial data bit corresponding to the first sense voltage.

22. The memory device of claim 18 wherein the read circuit sets the N-bit count to an initial value of the most significant bit being a logic 1 and all other bits being a logic 0 prior to operation in the first mode.

23. The memory device of claim 18 wherein the read circuit further comprises a sense amplifier adapted to receive the sense voltages, a switching circuit coupled to the sense amplifier, and an up/down counter coupled to the switching circuit.

24. A computer system, comprising:
a data input device;
a data output device;
a processor coupled to the data input and output devices; and
a memory device coupled to the processor, the memory device comprising, an address bus;
a control bus;
a data bus;
an address decoder coupled to the address bus;
a read/write circuit coupled to the data bus;
a control circuit coupled to the control bus;
a memory-cell array including a plurality of resistive memory cells, the array being coupled to the address decoder, control circuit, and read/write circuit; and
a read circuit coupled to the memory-cell array and read/write circuit for sensing the logic state of a data bit stored in a selected resistive memory cell in the array, the read circuit adapted to receive a sense voltage from the selected resistive memory cell and operable in a first mode to detect a first sense voltage for a first time and to generate an N-bit count responsive to the detected first sense voltage, operable in a second mode to detect a second sense voltage for a second time and to adjust the count responsive to the detected second sense voltage, and operable in a third mode to detect a third sense voltage for a third time and to adjust the count responsive to the detected third sense voltage, with the read circuit applying a single bit of the N-bit count to the read/write circuit after the third mode and the single bit representing the logic state of an initial data bit corresponding to the first sense voltage, the first time equal to 2T and the second and third times each equal to T.

25. The computer system of claim 24 wherein the memory device comprises an MRAM.

26. The computer system of claim 24 wherein the read circuit further comprises a sense amplifier, a switching circuit coupled to the sense amplifier, and an up/down counter coupled to the switching circuit.

27. A method of sensing data stored in a selected resistive memory cell, the method comprising:
generating a first count representing the logic state of an unknown initial data bit stored in the selected memory cell, the first count generated over a time period 2T;
generating a second count representing a data bit having a first known logic state stored in the selected memory cell;
generating a third count representing a data bit having a second known logic state stored in the selected memory cell, the second and third counts each generated over a time period T; and
determining the logic state of the unknown initial data bit stored in the selected memory cell from the first, second, and third counts.

28. The method of claim 27 wherein the operations of generating each comprise:
applying a current through the selected resistive memory cell and sensing the voltage developed responsive to the applied current;
generating a plurality of up count signals and down count signals responsive to the sensed voltage; and
adjusting the count responsive to the up count and down count signals.

29. The method of claim 27 wherein determining the logic state of the unknown initial data bit stored in the selected memory cell from the first, second, and third counts comprises subtracting the second and third counts from the first count to generate a final count.

30. The method of claim 29 further comprising determining the unknown logic state from a most significant bit of the final count.

31. The method of claim 27 wherein the resistive memory cell comprises an MRAM memory cell.

32. The method of claim 27 wherein the first known logic state comprises a logic 1 and the second known logic state comprises a logic 0.

33. The method of claim 32 wherein the second count representing a data bit having the first known logic state is greater than the third count representing a data bit having the second known logic state.

34. A method of sensing data stored in a selected resistive memory cell, the method comprising:
generating an interim count representing the logic state of an unknown initial data bit stored in the selected memory cell over a time T;
generating a first count by doubling the interim count;
generating a second count representing a data bit having a first known logic state stored in the selected memory cell;
generating a third count representing a data bit having a second known logic state stored in the selected memory cell; and
determining the logic state of the unknown initial data bit stored in the selected memory cell from the first, second, and third counts.

35. The method of claim 34 wherein the operations of generating each comprise:
applying a current through the selected resistive memory cell and sensing the voltage developed responsive to the applied current;
generating a plurality of up count signals and down count signals responsive to the sensed voltage; and
adjusting the count responsive to the up count and down count signals.

36. The method of claim 34 wherein determining the logic state of the unknown initial data bit stored in the selected memory cell from the first, second, and third counts comprises subtracting the second and third counts from the first count to generate a final count.

37. The method of claim 36 further comprising determining the unknown logic state from a most significant bit of the final count.

38. The method of claim 34 wherein the resistive memory cell comprises an MRAM memory cell.

39. The method of claim 34 wherein the first known logic state comprises a logic 1 and the second known logic state comprises a logic 0.

40. The method of claim 39 wherein the second count representing a data bit having the first known logic state is greater than the third count representing a data bit having the second known logic state.

41. A read circuit for sensing the logic state of a data bit stored in a resistive memory cell, the read circuit adapted to receive a sense voltage from a selected resistive memory cell, and the read circuit operable in a first mode to detect a first sense voltage corresponding to an unknown logic state and to generate an N-bit count responsive to the detected first sense voltage, operable in a second mode to detect a second sense voltage corresponding to a first known logic state and to adjust the count responsive to the detected second sense voltage, and operable in a third mode to detect a third sense voltage corresponding to a second known logic state and to adjust the count responsive to the detected third sense voltage, with a single bit of the N-bit count after the third mode representing the unknown logic state to the first sense voltage, the data circuit generating a plurality of up count signals and down count signals during each mode responsive to the respective sense voltages.

42. The read circuit of claim 41 wherein the data circuit operates in the first mode for a time 2T and wherein the data circuit operates in each of the second and third times for a time T.

43. The read circuit of claim 41 wherein the most significant bit of the N-bit count after the third mode represents the logic state of the initial data bit corresponding to the first sense voltage.

44. The read circuit of claim 43 wherein the logic state of the most significant bit equals the logic state of the initial data bit corresponding to the first sense voltage.

45. The read circuit of claim 41 wherein the data circuit operates during the first mode to increment the count responsive to each up count signal and to decrement the count responsive to each down count signal.

46. The read circuit of claim 41 wherein the data circuit operates during the second and third modes to decrement the count responsive to each up count signal and to increment the count responsive to each down count signal.

47. The read circuit of claim 41 wherein the resistive memory cell comprises an MRAM memory cell.

48. The read circuit of claim 41 wherein the read circuit sets the N-bit count to an initial value of the most significant bit being a logic 1 and all other bits being a logic 0 prior to operation in the first mode.

49. The read circuit of claim 41 further comprising a sense amplifier adapted to receive the sense voltages, a switching circuit coupled to the sense amplifier, and an up/down counter coupled to the switching circuit.

50. A read circuit for sensing the logic state of a data bit stored in a resistive memory cell, the read circuit adapted to receive a sense voltage from a selected resistive memory cell, and the read circuit operable in a first mode to detect a first sense voltage corresponding to an unknown logic state and to generate an N-bit count responsive to the detected first sense voltage, operable in a second mode to detect a second sense voltage corresponding to a first known logic state and to adjust the count responsive to the detected second sense voltage, and operable in a third mode to detect a third sense voltage corresponding to a second known logic state and to adjust the count responsive to the detected third sense voltage, with a single bit of the N-bit count after the third mode representing the unknown logic state to the first sense voltage, the read circuit setting the N-bit count to an initial value of the most significant bit being a logic 1 and all other bits being a logic 0 prior to operation in the first mode.

51. The read circuit of claim 50 wherein the data circuit operates in the first mode for a time 2T and wherein the data circuit operates in each of the second and third times for a time T.

52. The read circuit of claim 50 wherein the most significant bit of the N-bit count after the third mode represents the logic state of the initial data bit corresponding to the first sense voltage.

53. The read circuit of claim 52 wherein the logic state of the most significant bit equals the logic state of the initial data bit corresponding to the first sense voltage.

54. The read circuit of claim 50 wherein the data circuit generates a plurality of up count signals and down count signals during each mode responsive to the respective sense voltages.

55. The read circuit of claim 54 wherein the data circuit operates during the first mode to increment the count responsive to each up count signal and to decrement the count responsive to each down count signal.

56. The read circuit of claim 54 wherein the data circuit operates during the second and third modes to decrement the count responsive to each up count signal and to increment the count responsive to each down count signal.

57. The read circuit of claim 50 wherein the resistive memory cell comprises an MRAM memory cell.

58. The read circuit of claim 50 further comprising a sense amplifier adapted to receive the sense voltages, a switching circuit coupled to the sense amplifier, and an up/down counter coupled to the switching circuit.

59. A memory device, comprising:

an address bus;

a control bus;

a data bus;

an address decoder coupled to the address bus;

a read/write circuit coupled to the data bus;

a control circuit coupled to the control bus;

a memory-cell array including a plurality of resistive memory cells, the array being coupled to the address decoder, control circuit, and read/write circuit; and a read circuit coupled to the memory-cell array and read/write circuit for sensing the logic state of a data bit stored in a selected resistive memory cell in the array, the read circuit adapted to receive a sense voltage from the selected resistive memory cell and operable in a first mode to detect a first sense voltage for a first time and to generate an N-bit count responsive to the detected first sense voltage, operable in a second mode to detect a second sense voltage for a second time and to adjust the count responsive to the detected second sense voltage, and operable in a third mode to detect a third sense voltage for a third time and to adjust the count responsive to the detected third sense voltage, with the read circuit applying a single bit of the N-bit count to the read/write circuit after the third mode and the single bit representing the logic state of an initial data bit corresponding to the first sense voltage, the read circuit setting the N-bit count to an initial value of the most significant bit being a logic 1 and all other bits being a logic 0 prior to operation in the first mode.

60. The memory device of claim 59 wherein the memory device comprises an MRAM.

61. The memory device of claim 59 wherein the first time equals 2T and wherein the second and third times each equal T.

62. The memory device of claim 59 wherein the most significant bit of the N-bit count after the third mode represents the logic state of the initial data bit corresponding to the first sense voltage.

63. The memory device of claim 62 wherein the logic state of the most significant bit equals the logic state of the initial data bit corresponding to the first sense voltage.

64. The memory device of claim 59 wherein the read circuit further comprises a sense amplifier adapted to receive the sense voltages, a switching circuit coupled to the sense amplifier, and an up/down counter coupled to the switching circuit.

* * * * *

UNITED STATES PATENT AND TRADEMARK OFFICE
CERTIFICATE OF CORRECTION

Figure 4:
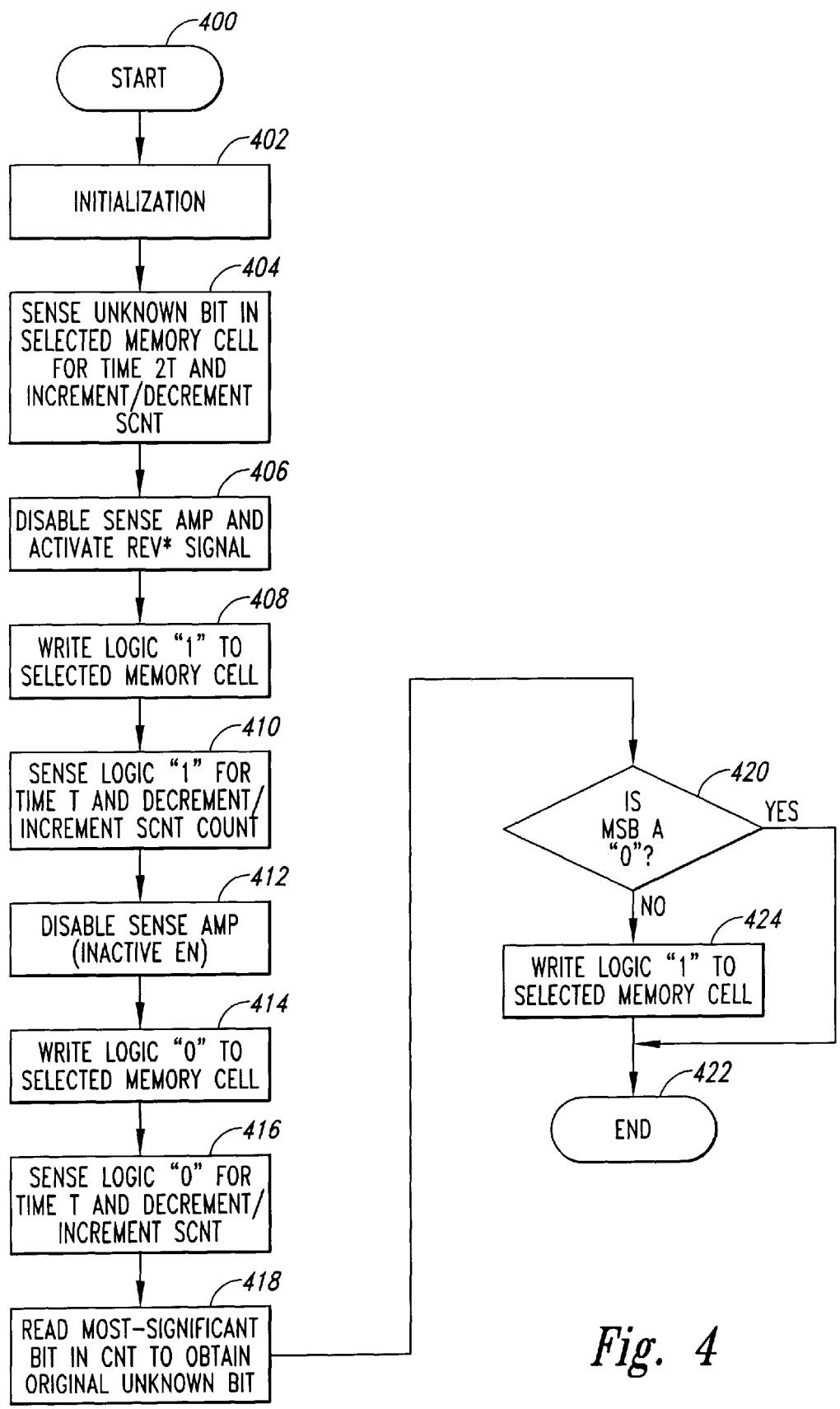
FIG. 4 is flowchart illustrating the overall process executed by the read circuit of FIG. 3.

PATENT NO. : 6,813,208 B2
APPLICATION NO. : 10/192463
DATED : November 2, 2004
INVENTOR(S) : R. Jacob Baker It is certified that error appears in the above-identified patent and that said Letters Patent is hereby corrected as shown below:

| Column, Line | Reads | Should Read |
|---|---|---|
| Column 1, Line 48 | "increasing popular" | --increasingly popular-- |
| Column 2, Line 24 | "generated respective" | --generate respective-- |
| Column 3, Line 62 | "204 the internal count" | --204 and the internal count-- |
| Column 4, Line 50 | "RCNT counts." | --SCNT counts.-- |
| Column 4, Line 51 | "to a give logic state" | --to a given logic state-- |
| Column 5, Line 27 | "FIG. 4 is flowchart" | --FIG. 4 is a flowchart-- |
| Column 5, Line 47 | "generates single" | --generates a single-- |
| Column 6, Line 57 | "gates 308,310" | --gates 308, 310-- |
| Column 7, Line 14 | "immediately step" | --immediately to step-- |
| Column 7, Line 47 | "transmission gate 3108" | --transmission gate 310-- |
| Column 7, Line 54 | "signal pulses receive." | --signal pulses received.-- |
| Column 7, Line 56 | "may generate 251 UCLK" | --may generate 251 UCLK-- |
| Column 7, Line 57 | "and 249 DCLK signal" | --and 249 DCLK signal-- |
| Column 7, Line 62 | "counter 306 as incremented" | --counter 306 has incremented-- |
| Column 8, Line 3 | "counter as decremented" | --counter has decremented-- |
| Column 9, Line 47 | "stored in a logic 1." | --stored is a logic 1.-- |
| Column 9, Line 49 | "stored a logic 0." | --stored is a logic 0.-- |
| Column 9, Line 64 | "circuit rights a logic 1" | --circuit writes a logic 1-- |
| Column 10, Line 36 | "times T whether" | --time T when-- |

UNITED STATES PATENT AND TRADEMARK OFFICE
CERTIFICATE OF CORRECTION

PATENT NO. : 6,813,208 B2
APPLICATION NO. : 10/192463
DATED : November 2, 2004
INVENTOR(S) : R. Jacob Baker It is certified that error appears in the above-identified patent and that said Letters Patent is hereby corrected as shown below:

| Column, Line | Reads | Should Read |
|---|---|---|
| Column 12, Line 31 | "since X>Y then," | --since X>Y, then-- |
| Column 12, Line 47 | "is greater tha" | --is greater than the initial value IV.-- |
| Column 13, Line 7 | "a known a logic 1" | --a known logic 1-- |

Signed and Sealed this

Thirty-first Day of October, 2006

JON W. DUDAS
*Director of the United States Patent and Trademark Office*